United States Patent
Endo et al.

(10) Patent No.: US 9,839,165 B2
(45) Date of Patent: Dec. 5, 2017

(54) MODULAR DATA CENTER AND CONTROLLING METHOD OF MODULAR DATA CENTER

(71) Applicant: FUJITSU LIMITED, Kawasaki-shi, Kanagawa (JP)

(72) Inventors: Hiroshi Endo, Isehara (JP); Hiroyoshi Kodama, Isehara (JP); Masatoshi Ogawa, Isehara (JP); Hiroyuki Fukuda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 307 days.

(21) Appl. No.: 14/699,109

(22) Filed: Apr. 29, 2015

(65) Prior Publication Data

US 2015/0250077 A1 Sep. 3, 2015

Related U.S. Application Data

(63) Continuation of application No. PCT/JP2012/078493, filed on Nov. 2, 2012.

(51) Int. Cl.
*H05K 7/20* (2006.01)
*H05K 7/14* (2006.01)

(52) U.S. Cl.
CPC ....... *H05K 7/20836* (2013.01); *H05K 7/1488* (2013.01); *H05K 7/20736* (2013.01); *H05K 7/20745* (2013.01); *H05K 7/20818* (2013.01)

(58) Field of Classification Search
None
See application file for complete search history.

(56) References Cited

U.S. PATENT DOCUMENTS

2004/0163001 A1* 8/2004 Bodas ............... G06F 1/206
                                                    713/300
2008/0204999 A1    8/2008 Clidaras et al.
(Continued)

FOREIGN PATENT DOCUMENTS

CN    202350192 U  *  7/2012
JP    2009-300058     12/2009
(Continued)

OTHER PUBLICATIONS

EESR—Extended European Search Report of European Patent Application No. 12887551.5 dated Nov. 11, 2015.
(Continued)

*Primary Examiner* — Jason Lin
(74) *Attorney, Agent, or Firm* — Fujitsu Patent Center

(57) ABSTRACT

A modular data center includes a fan creating a first cooling wind from outside air, an air conditioner creating a second cooling wind having a temperature lower than that of the outside air, racks housing electronic devices that take in the first and the second cooling wind, and a control unit adjusting an air volume of the first cooling wind by controlling the fan, and so as to cool the electronic device to a specified temperature. The control unit executes stopping the air conditioner when a first assumed value of a sum of air-conditioning power of the air conditioner and the fan is smaller than a current value of the air-conditioning power, and operating the air conditioner when a second assumed value of the sum of air-conditioning power of the air conditioner and the fan is smaller than the current value of the air-conditioning power.

10 Claims, 11 Drawing Sheets

(56) References Cited

U.S. PATENT DOCUMENTS

| | | | |
|---|---|---|---|
| 2009/0138313 A1* | 5/2009 | Morgan | G06Q 10/06 |
| | | | 705/7.23 |
| 2010/0076607 A1* | 3/2010 | Ahmed | G06F 1/206 |
| | | | 700/276 |
| 2011/0257794 A1 | 10/2011 | Nishino et al. | |
| 2011/0306288 A1* | 12/2011 | Murayama | F24F 11/0001 |
| | | | 454/184 |
| 2012/0190292 A1 | 7/2012 | Skrepcinski et al. | |
| 2014/0014292 A1* | 1/2014 | Rice | H05K 7/20745 |
| | | | 165/11.1 |

FOREIGN PATENT DOCUMENTS

| | | |
|---|---|---|
| JP | 2010-156494 | 7/2010 |
| JP | 2010-261696 | 11/2010 |
| JP | 2011-75194 | 4/2011 |
| JP | 2011-242077 | 12/2011 |
| JP | 2011-257062 | 12/2011 |
| JP | 2012-107801 | 6/2012 |
| JP | 2012-184864 | 9/2012 |
| WO | 20110073668 | 6/2011 |

OTHER PUBLICATIONS

International Search Report, dated in connection with PCT/JP2012/078493 and dated Jan. 22, 2013.
CNOA—Office Action of corresponding Chinese Patent Application No. 201280076738.5 dated Nov. 2, 2016, with English translation of the Office Action.

* cited by examiner

| temperature T (°C) | humidity H (%) | | | | | | | |
|---|---|---|---|---|---|---|---|---|
| | 80 | 70 | 60 | 50 | 40 | 30 | 20 | 10 |
| 27 | 1.094 | 1.094 | 1.094 | 1.094 | 1.094 | 1.094 | 1.094 | 1.094 |
| 27.5 | 1.138 | 1.138 | 1.138 | 1.138 | 1.138 | 1.138 | 1.138 | 1.138 |
| 28 | 1.186 | 1.186 | 1.186 | 1.186 | 1.186 | 1.186 | 1.186 | 1.186 |
| 28.5 | 1.238 | 1.238 | 1.238 | 1.238 | 1.238 | 1.238 | 1.238 | 1.238 |
| 29 | 1.293 | 1.293 | 1.293 | 1.293 | 1.293 | 1.293 | 1.293 | 1.293 |
| 29.5 | 1.351 | 1.351 | 1.351 | 1.351 | 1.351 | 1.351 | 1.351 | 1.351 |
| 30 | 1.413 | 1.413 | 1.413 | 1.413 | 1.413 | 1.413 | 1.413 | 1.413 |
| 30.5 | 1.479 | 1.479 | 1.479 | 1.479 | 1.479 | 1.479 | 1.479 | 1.479 |
| 31 | 1.549 | 1.549 | 1.549 | 1.549 | 1.549 | 1.549 | 1.549 | 1.549 |
| 31.5 | 1.622 | 1.622 | 1.622 | 1.622 | 1.622 | 1.622 | 1.622 | 1.622 |
| first assumed value P₁ of the air-conditioning power (kW) | | | | | | | | |

32:

| temperature T (°C) | humidity H (%) | | | | | | | |
|---|---|---|---|---|---|---|---|---|
| | 80 | 70 | 60 | 50 | 40 | 30 | 20 | 10 |
| 27 | 1.361 | 1.311 | 1.264 | 1.221 | 1.181 | 1.147 | 1.119 | 1.097 |
| 27.5 | 1.397 | 1.343 | 1.292 | 1.244 | 1.199 | 1.160 | 1.129 | 1.102 |
| 28 | | 1.378 | 1.322 | 1.269 | 1.218 | 1.176 | 1.138 | 1.109 |
| 28.5 | 1.477 | 1.415 | 1.354 | 1.297 | 1.241 | 1.193 | 1.150 | 1.117 |
| 29 | 1.521 | 1.456 | 1.390 | 1.327 | 1.265 | 1.212 | 1.154 | 1.126 |
| 29.5 | 1.569 | 1.500 | 1.429 | 1.360 | 1.293 | 1.231 | 1.179 | 1.136 |
| 30 | 1.623 | 1.548 | 1.472 | 1.395 | 1.323 | 1.255 | 1.196 | 1.148 |
| 30.5 | 1.678 | 1.600 | 1.518 | 1.437 | 1.356 | 1.280 | 1.215 | 1.160 |
| 31 | 1.733 | 1.650 | 1.563 | 1.468 | 1.389 | 1.308 | 1.235 | 1.173 |
| 31.5 | 1.803 | 1.716 | 1.624 | 1.528 | 1.433 | 1.341 | 1.259 | 1.189 |
| second assumed value P₂ of the air-conditioning power (kW) | | | | | | | | |

MODULAR DATA CENTER AND CONTROLLING METHOD OF MODULAR DATA CENTER

CROSS-REFERENCE TO RELATED APPLICATION

This application is a continuation of International Patent Application No. PCT/JP2012/78493 filed on Nov. 2, 2012 and designated the U.S., the entire contents of which are incorporated herein by reference.

FIELD

The embodiments discussed herein are related to a modular data center and a controlling method of a modular data center.

BACKGROUND

Electronic devices such as servers are installed in a data center. As a method of cooling the electronic devices, there is a method using outside air. According to this method, the outside air is taken into the data center by rotating fans, and the electronic devices are cooled directly with the outside air, without the outside air being cooled by using a heat exchanger and the like. Thus, this method does not require electric power for the heat exchanger and the like, and is therefore able to contribute to energy saving in the whole of the data center.

However, when the outside air is directly used in the case where the temperature of the outside air is high as in summer, the electronic devices may be cooled insufficiently. Moreover, when an air conditioner having a cooling function is used as an auxiliary cooler in order to prevent the insufficient cooling, the power required for the air conditioning increases by an amount for the air conditioner, in some operating conditions of the air conditioner, and the energy saving in the data center cannot be realized.

Note that techniques relating to the present application are disclosed in Japanese Laid-open Patent Publication No. 2009-300058 and Japanese Laid-open Patent Publication No. 2010-156494.

SUMMARY

According to one aspect discussed herein, there is provided a modular data center including an enclosure, a fan provided in the enclosure and configured to create a first cooling wind from outside air without changing a temperature of the outside air, an air conditioner provided in the enclosure and configured to create a second cooling wind having a temperature lower than the temperature of the outside air, a plurality of racks provided in the enclosure and configured to house a plurality of electronic devices each provided with an intake face to take in the first cooling wind and the second cooling wind, and a control unit configured to adjust an air volume of the first cooling wind by controlling the fan, and so as to cool a temperature of each electronic device to a specified temperature, wherein the control unit executes stopping the air conditioner when a first assumed value of a sum of air-conditioning power of the air conditioner and the fan, which is assumed to be consumed in a case of cooling the temperature of each electronic device to the specified temperature by using the first cooling wind while stopping the air conditioner, is smaller than a current value of the air-conditioning power, and operating the air conditioner when a second assumed value of the sum of air-conditioning power of the air conditioner and the fan, which is assumed to be consumed in a case of cooling the temperature of each electronic device to the specified temperature by using the first cooling wind and the second cooling wind while operating the air conditioner, is smaller than the current value of the air-conditioning power.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 includes tables schematically illustrating contents of processing in step S5 of the first embodiment;

DESCRIPTION OF EMBODIMENTS

Prior to descriptions of embodiments, results of studies conducted by the inventors of the present application will be explained.

While there are various types of data centers, a data center constructed by housing a fan unit and rack into a container is called a modular data center. Such a modular center has high cooling efficiency and therefore has an advantage in energy saving because only the space in the container needs to be cooled.

Figure 1:
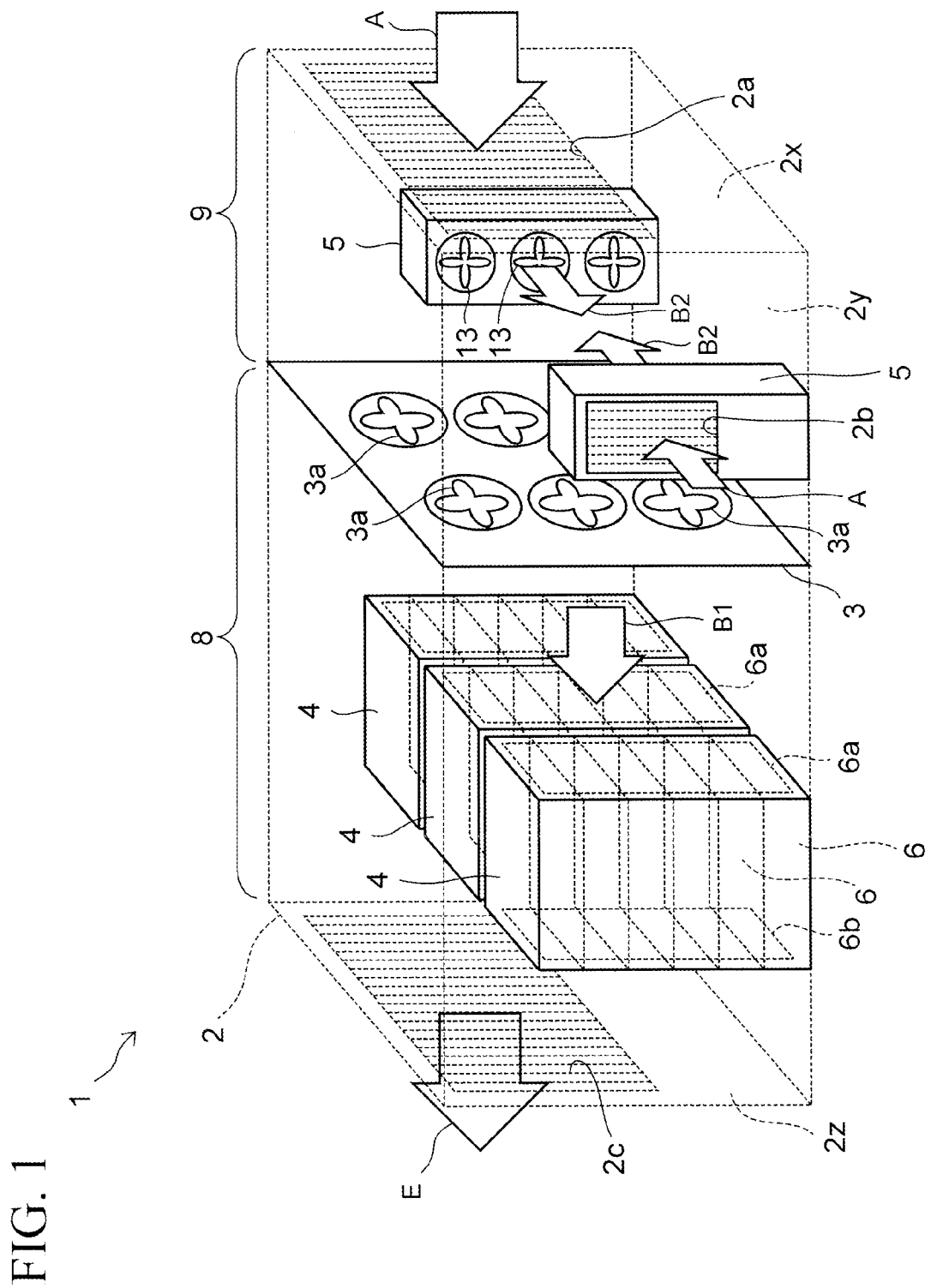
FIG. 1 is a perspective view illustrating an internal configuration of a modular data center.

FIG. 1 is a perspective view illustrating an internal configuration of a modular data center used for the studies by the inventors of the present application.

This modular data center 1 includes a metallic container 2, which is an example of an enclosure. A fan unit 3, a plurality of racks 4 opposed thereto, and air conditioners 5 are provided in the container 2.

The container 2 has a rectangular parallelepiped shape provided with first to third side faces $2x$, $2y$, and $2z$. First and second intake ports $2a$ and $2b$ for taking in outside air A are provided respectively to the first side face 2x and the second side face 2y adjacent thereto, while an exhaust port 2c is provided to the third side face 2z.

Here, the shape of the first intake port 2a is not limited to a particular shape. The first intake port 2a may be formed from an aggregate of holes. Alternatively, a single opening may be formed as the first intake port 2a. This is also the case for the second intake port 2b and the exhaust port 2c.

The fan unit 3 is always in an operating state as long as the data center 1 is in operation. The fan unit 3 includes a plurality of fans 3a which create a first cooling wind B1 from outside air A taken in from the first intake port 2a.

In order to suppress power consumption of the fan unit 3, the fan unit 3 is not provided with a cooling mechanism such as a heat exchanger for cooling the outside air A. Accordingly, the first cooling wind B1 is created directly from the outside air A without changing the temperature of the outside air A.

The air conditioner 5 creates a second cooling wind B2 by cooling the outside air A taken in from the second intake port 2b. The second cooling wind B2 is supplied to upstream of the fans 3a by the air conditioner 5, and is then guided to electronic devices 6 by the fan 3a. Unlike the fan unit 3, the air conditioner 5 has the function to cool the outside air A in this manner. Accordingly, the temperature of the second cooling wind B2 becomes lower than that of the outside air A.

The type of each air conditioner 5 is not particularly limited. For example, a packaged air conditioner or an evaporative cooling device can be used as the air conditioner 5. Of these devices, the evaporative cooling device has an advantage over the packaged air conditioner in that the evaporative cooling device is capable of not only cooling the outside air A but also adjusting humidity in the container 2 by humidifying the outside air A.

The plurality of racks 4 are arranged in a width direction of the container 2. Moreover, the racks 4 hold the electronic devices 6 such as servers, which are air cooled by the above-described cooling winds B1 and B2. Each electronic device 6 has an intake face 6a for taking in the cooling winds B1 and B2. Each electronic device 6 is cooled by the cooling winds B1 and B2 which are taken in from the intake face 6a. Then, an exhaust flow E warmed after the cooling is discharged from an exhaust face 6b of each electronic device 6, and then released to the outside via the exhaust port 2c of the container 2.

Here, a space between the fan unit 3 and the exhaust port 2c in the container 2 is served as a server room 8 in which the plurality of racks 4 are installed. Meanwhile, a space between the fan unit 3 and the first intake port 2a in the container 2 is served as an air-conditioning room 9 to which the above-described outside air A as well as the second cooling winds B2 are supplied.

Figure 2:
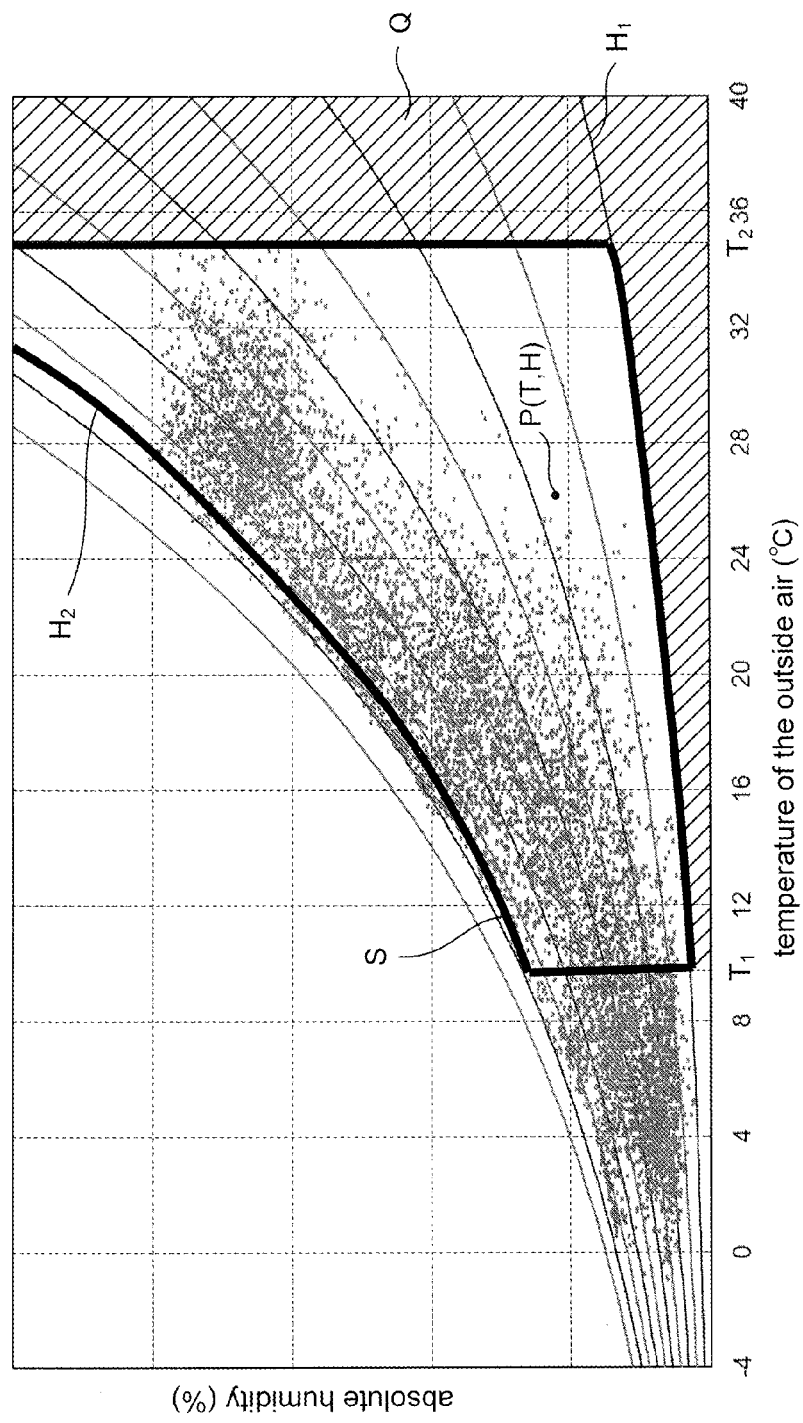
FIG. 2 is a psychrometric chart for explaining an operation guarantee region of an electronic device.

In the data center 1, in addition to the first cooling wind B1 created directly from the outside air A as described above, the second cooling winds B2 created by cooling the outside air A with the air conditioners 5 are also used to cool the electronic devices 6. Accordingly, even when it is difficult to sufficiently cool the electronic devices 6 only with the first cooling wind B1 like in summer, the electronic devices 6 are prevented from being insufficient cooling by using the second cooling winds B2 concurrently FIG. 2 is a psychrometric chart for explaining an operation guarantee region of each electronic device. The psychrometric chart plots iso-relative humidity lines. The horizontal axis of the chart indicates a dry-bulb temperature and the vertical axis thereof indicates an absolute humidity.

In the following, a temperature T of the outside air A is assumed to be measured as the dry-bulb temperature, while a humidity H of the outside air A is assumed to be measured as a relative humidity. A plurality of dots in FIG. 2 represents actual measured values of the dry-bulb temperatures and the relative humidities of the outside air in Tokyo.

A temperature range $T_1$ to $T_2$ of the dry-bulb temperature and a humidity range $H_1$ to $H_2$ of the relative humidity are set to each electronic device 6 in order to guarantee an operation thereof. In FIG. 2, a region inside these temperature range and the humidity range is indicated as an operation guarantee region S.

In the following, the temperature range $T_1$ to $T_2$ is set to a range from 10° C. to 35° C., and the humidity range $H_1$ to $H_2$ is set to a range from 10% to 85%, for example. A lower limit temperature $T_1$ and an upper limit temperature $T_2$ of the temperature range $T_1$ to $T_2$ are limit temperatures which allow normal operation of a unillustrated operating unit such as a CPU (central processing unit) and a GPU (graphical processing unit) in the electronic device 6. Meanwhile, a lower limit humidity $H_1$ in the humidity range $H_1$ to $H_2$ is an approximate humidity at which the electronic device 6 is likely to be damaged by static electricity due to dry air, while an upper limit humidity $H_2$ is a humidity at which dew condensation due to highly humid air is likely to occur in the electronic device 6.

When a state point P, whose coordinates are the temperature T and the humidity H of the outside air A, is located within the operation guarantee region S, it is possible to air cool the electronic devices 6 by directly using the outside air A. Accordingly, in this case, the air conditioners 5 may be stopped so that the electronic devices 6 can be cooled only by the first cooling wind B1 without using the second cooling winds B2.

On the other hand, when the temperature T of the outside air A is higher than the upper limit temperature $T_2$ of the operation guarantee region S as in summer, the second cooling wind B2 having the lower temperature than that of the outside air A are also created by operating the air conditioner 5. Thus, a state point of a mixed air flow of the first cooling wind B1 and the second cooling winds B2 falls within the operation guarantee region S, and the electronic devices 6 can be prevented from being cooling insufficiency.

Meanwhile, when the humidity H of the outside air A is lower than the lower limit humidity $H_1$ of the operation guarantee region S, the electronic devices 6 can be humidified by creating the second cooling winds B2 having a higher humidity than that of the outside air A by operating the air conditioners 5. However, even when the humidity H of the outside air A is lower than the lower limit humidity $H_1$, the air conditioners 5 are stopped when the temperature T of the outside air A is lower than lower limit temperature $T_1$, because the temperatures of the cooling winds B1 and B2 will further drop below the lower limit temperature $T_1$ as a result of operating the air conditioners 5.

In FIG. 2, a region to operate the air conditioners as described above is hatched, and this region is indicated as an operation region Q. Moreover, the upper limit temperature $T_2$ located on a boundary between the operation region Q and the operation guarantee region S constitutes one of threshold temperatures to operate the air conditioners 5.

Hence, the air conditioners 5 are operated when the temperature T of the outside air A is higher than the upper limit temperature $T_2$. However, actual temperatures of the electronic devices 6 also depend on an air volume of the first cooling wind B1. For example, even when the temperature T of the outside air A is constant, the electronic devices 6 are cooled down more efficiently when the air volume of the first cooling wind B1 is larger. On the other hand, when the air volume of the first cooling wind B1 is small, the electronic devices 6 are likely to be in insufficient cooling.

Furthermore, amounts of heat generation by the electronic devices 6 may be increased when operating rates of the electronic devices 6 are high. In this case, the electronic devices 6 may not be sufficiently cooled unless the air volume of the first cooling wind B1 is increased.

Accordingly, the mere operation of the air conditioners 5 as in the above is not enough for controlling the temperatures of the electronic devices 6. The electronic devices 6 need to be cooled to a predetermined temperature by controlling the numbers of rotations of the fans 3a and thereby adjusting the air volume of the first cooling wind B1.

There are no limitations as to how much the electronic devices 6 are to be cooled. In the following, a temperature at which each electronic device 6 causes thermal runaway is preset as a specified temperature $T_s$, and the number of rotations of the fans 3a are controlled such that the temperature of each electronic device 6 does not exceed the specified temperature $T_s$.

Power consumption of the fans 3a is approximately proportional to the cube of the air volume of the first cooling wind B1. Accordingly, the power consumption of the fan unit 3 rises rapidly when the air volume of the first cooling wind B1 is increased along with a rise in the operating rate of each electronic device 6 or a rise in the temperature T of the outside air A.

Moreover, since the air conditioners 5 are used in this example, the energy saving in the data center 1 is prevented by the power consumption of each of the air conditioners 5 and the fan unit 3.

Meanwhile, each air conditioner 5 creates the second cooling wind B2 having the lower temperature than that of the outside air A. Accordingly, by using the air conditioners 5 concurrently, the amount of the first cooling wind B1 required for cooling the electronic devices 6 to the specified temperature $T_s$ is thought to be less than that in the case of cooling the electronic devices 6 only by the first cooling wind B1. For this reason, in some operating condition of the air conditioners 5, a sum of air-conditioning power $P_0$ of the fan unit 3 and the air conditioners 5 is thought to be smaller than that in the case of operating the fan unit 3 only.

The inventors of the present application investigated in which case the air conditioners 5 are to be operated in order to reduce the above air-conditioning power $P_0$.

Figure 3:
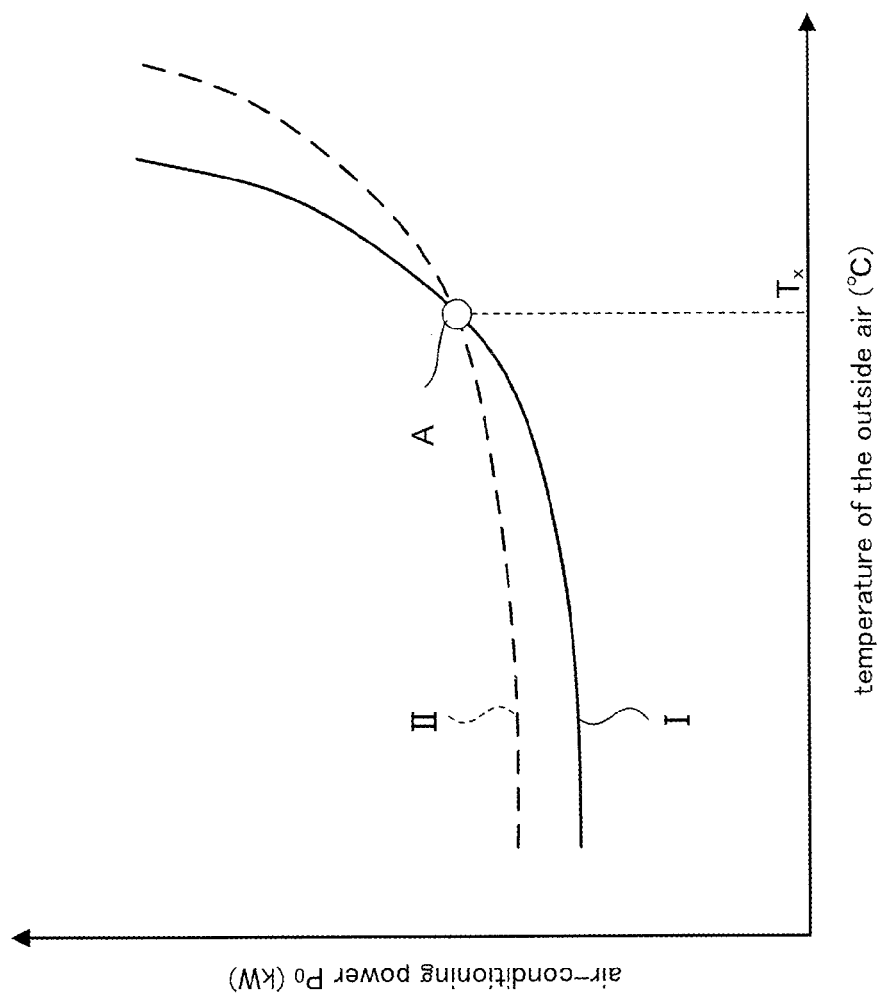
FIG. 3 is a graph illustrating a result of an investigation to investigate in which case air conditioners are to be operated in order to reduce air-conditioning power.

FIG. 3 illustrates a result of this investigation.

FIG. 3 is a graph illustrating a relation between the air-conditioning power $P_0$ required for cooling each electronic device 6 to the specified temperature $T_s$ and the temperature T of the outside air A when the operating rate of each electronic device 6 is fixed.

In this investigation, a graph I in the case of operating the fan unit 3 only and a graph II in the case of operating the fan unit 3 and the air conditioners 5 are acquired. Here, the air-conditioning power $P_0$ in the graph I represents the power consumption of the fan unit 3 only, while the air-conditioning power $P_0$ in the graph II represents a sum of the power consumption of the fan unit 3 and the air conditioners 5.

As illustrated in FIG. 3, there exists an intersection point A where the graphs I and II intersect with each other. Here, when the temperature T is lower than a temperature $T_x$ of the intersection point A, the air-conditioning power $P_0$ becomes lower by operating the fan unit 3 only. Meanwhile, when the temperature T is higher than the temperature $T_x$, the air-conditioning power $P_0$ becomes lower by operating the fan unit 3 as well as the air conditioners 5.

This result has made it clear that it is preferable to determine whether or not the air conditioners 5 are to be operated on the basis of the temperature $T_x$ of the intersection point A in order to reduce the air-conditioning power $P_0$. Note that the temperature $T_x$ of the intersection point A does not always coincide with the upper limit temperature $T_2$ illustrated in FIG. 2. Accordingly, when the operation of the air conditioners 5 is determined on the basis of the upper limit temperature $T_2$, some of the air-conditioning power $P_0$ may be consumed uselessly, which is disadvantageous for the energy saving in the data center 1.

In the followings, embodiments will be described.

(First Embodiment)

In this embodiment, the modular data center 1 of FIG. 1 is controlled as described below, so that the power consumption of the data center 1 is reduced.

Figure 4:
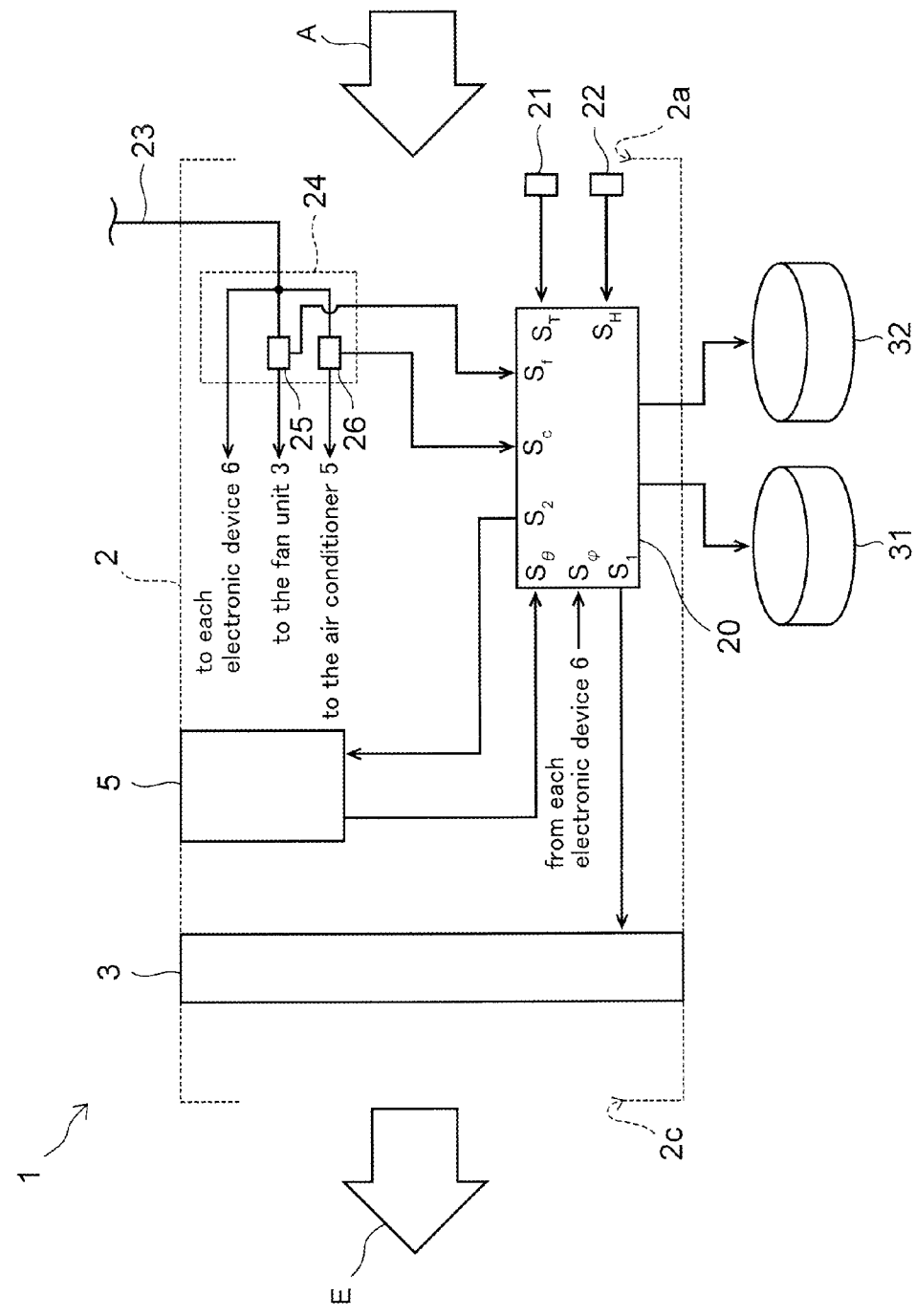
FIG. 4 is a functional block diagram of a modular data center according to first and second embodiments.

FIG. 4 is a functional block diagram of the modular data center 1. Note that this functional block diagram schematically illustrates functional links between the functional blocks in the modular data center 1. Accordingly, there are some portions which are different from an actual layout of constituents that correspond to each functions.

As illustrated in FIG. 4, in this embodiment, the modular data center 1 is provided with a control unit 20, a temperature sensor 21, a humidity sensor 22, a power line 23, and a switchboard 24.

Among them, as the control unit 20, a dedicated computer or one of the plurality of electronic devices 6 (see FIG. 1) may be used.

The control unit 20 outputs a first control signal $S_1$ to the fan unit 3. Thus, the control unit 20 adjusts the numbers of rotations of the fans 3a and controls the air volume of the first cooling wind B1, thereby cooling the electronic devices 6 to the specified temperature $T_s$. Note that a method of adjusting the numbers of rotations of the fans 3a is not particularly limited. However, it is preferable to cause the control unit 20 to monitor actual temperatures of the electronic devices 6 and to control the numbers of rotations of the fans 3a in real time in accordance with the actual temperatures.

Moreover, the control unit 20 outputs a second control signal $S_2$ to the air conditioner 5, thereby controlling the air volume of the second cooling wind B2 emitted from the air conditioner 5.

A packaged air conditioner or an evaporative cooling device can be used as the air conditioner 5.

Figure 5:
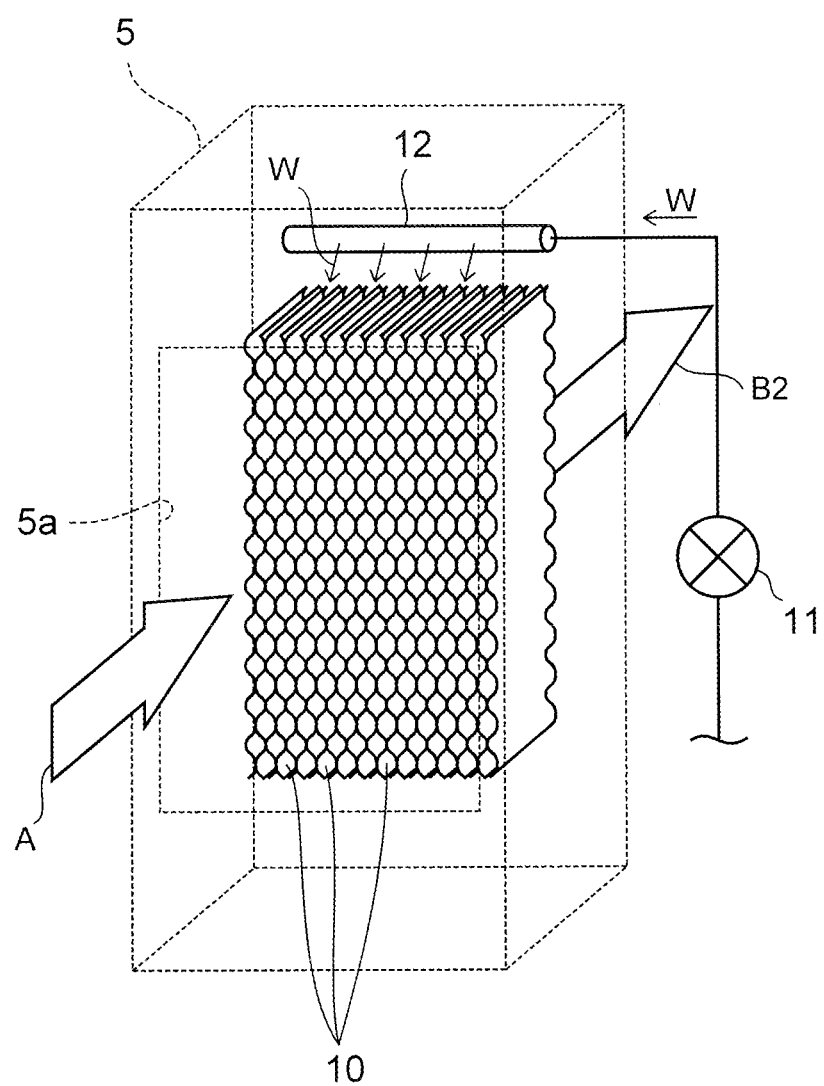
FIG. 5 is a partially exploded perspective view of an evaporative cooling device usable in the first and second embodiments.

FIG. 5 is a partially exploded perspective view of an evaporative cooling device which can be used as the air conditioner 5.

The air conditioner 5 includes water-absorbing elements 10 formed by molding polymer composite fibers, a nozzle 12 configured to drip water W on the elements 10, an electromagnetic valve 11 configured to control supply of the water W to the nozzle 12, and a plurality of fans 13 (see FIG. 1).

The air conditioner 5 is provided with an opening 5a. By rotating the fans 13, the outside air A is taken into the air conditioner 5 via the opening 5a and the second intake port 2b (see FIG. 1). The outside air A directly hits the water W absorbed in the elements 10. Thus, the outside air A is cooled by evaporative latent heat of the water W. At the same time, the outside air A is humidified. Thus, it is possible to create the second cooling wind B2 whose temperature and humidity are adjusted.

The above-described evaporative cooling device does not require a heat exchanger for cooling the outside air A, and therefore has an advantage in the energy saving as compared to a packaged air conditioner which uses a heat exchanger.

Reference is made to FIG. 4 again.

The power line 23 is used to supply electric power from outside into the data center 1. The power line 23 branches off to three lines at the switchboard 24 in the data center 1. One of the branched lines is connected to the fan unit 3, and the power consumption of all of the fans 3a in the fan unit 3 is monitored by a first power meter 25.

Meanwhile, another one of lines branched off from the power line 23 is connected to the air conditioners 5, and the power consumption of the air conditioners 5 is monitored by a second power meter 26. Moreover, the remaining one of the lines branched off from the power line 23 is connected to the plurality of electronic devices 6.

The first power meter 25 outputs the power currently consumed by the fan unit 3 to the control unit 20 as first power information $S_f$. Meanwhile, the second power meter 26 outputs the power currently consumed by the air conditioners 5 to the control unit 20 as second power information $S_c$.

In the meantime, the temperature sensor 21 and the humidity sensor 22 are provided at positions in the vicinity of the first intake port 2a and the like and exposed to the outside air A. The temperature sensor 21 and the humidity sensor 22 measure the temperature T and the humidity H of the outside air A respectively, and output the measured values to the control unit 20 as temperature information $S_T$ and humidity information $S_H$, respectively.

Furthermore, first operating rate information $S\phi$ is inputted from each of the plurality of electronic devices 6 to the control unit 20. The first operating rate information $S\phi$ is information indicating an operating rate $\phi_0$ of each electronic device 6, which is outputted from each electronic device 6. Although the operating rate $\phi_0$ is not particularly limited, the operating rate of the processing unit such as the CPU and the GPU included in the electronic device 6 may be adopted as the above-described operating rate $\phi_0$.

In the meantime, second operating rate information $S\theta$ indicating an operating rate $\theta$ of the air conditioner 5 is inputted from the air conditioner 5 to the control unit 20.

When the air conditioner 5 is the evaporative cooling device, the current operating rate $\theta$ is defined as a percentage of a ratio between maximum power consumption achievable by the fans 13 and current power consumption of the fans 13. On the other hand, when a package air conditioner is used as the air conditioner 5, the current operating rate $\theta$ is defined as a percentage of a ratio between maximum power consumption achievable by the packaged air conditioner and current power consumption of a heat exchanger and fans thereof.

Based on the temperature information $S_T$, the humidity information $S_H$, and the first and second operating rate information $S\phi$ and $S\theta$ described above, the control unit 20 can acquire parameters T, H, $\phi_0$, and $\theta$ in real time, which respectively correspond to the above information.

Then, based on the parameters, the control unit 20 refers to a first database 31 and a second database 32, and determines whether the air conditioners 5 are to be stopped or operated in order to reduce the air-conditioning power of the data center 1.

Here, the first database 31 and the second database 32 may be provided outside the modular data center 1 or may be held by the control unit 20. Note that the contents of the databases 31 and 32 will be described later.

Next, a controlling method of the modular data center of this embodiment will be described with reference to FIG. 4, FIG. 6, and the like.

Figure 6:
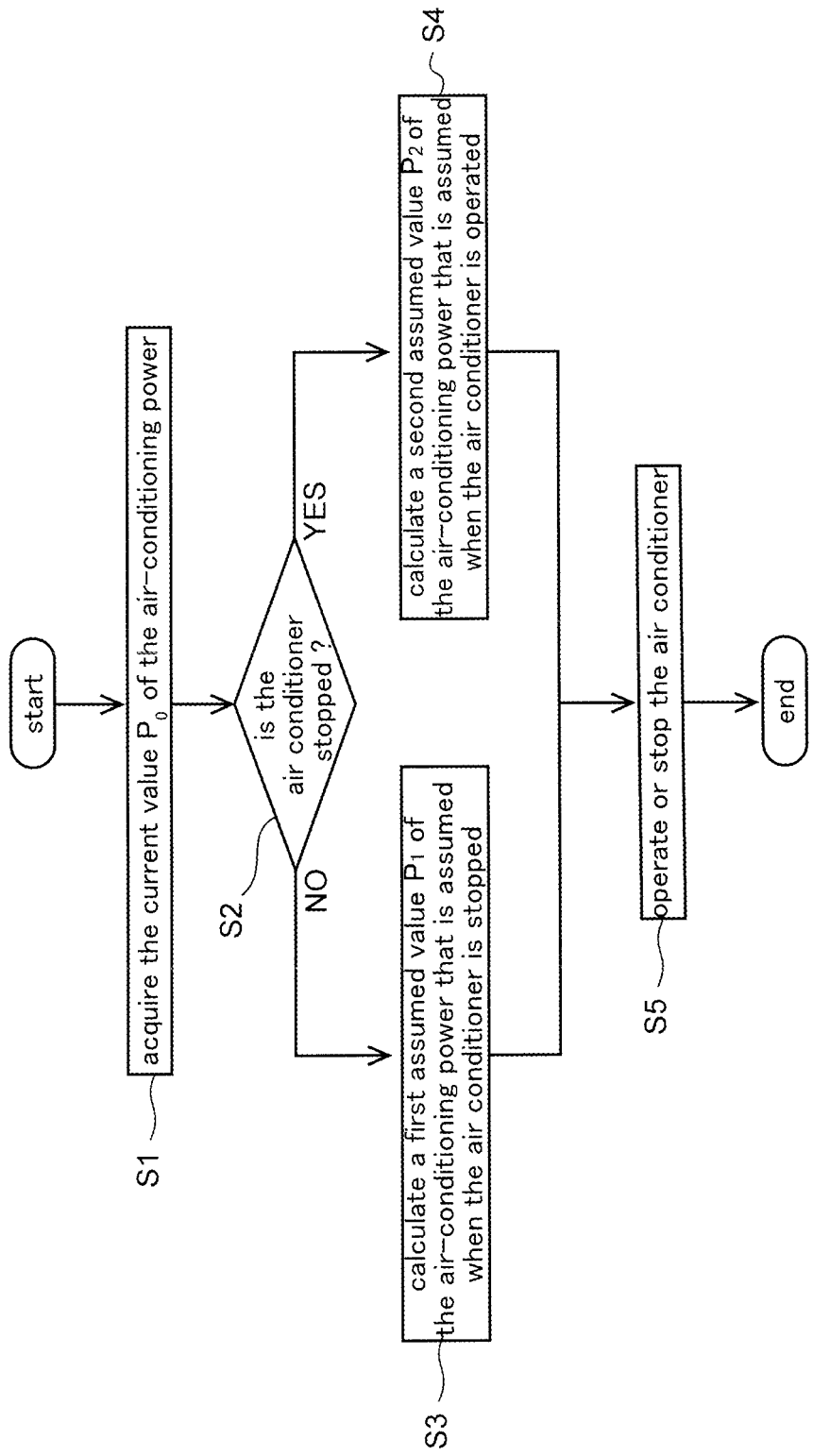
FIG. 6 is a flowchart illustrating a controlling method of the modular data center according to the first embodiment.

FIG. 6 is a flowchart illustrating the controlling method of the modular data center of this embodiment.

In the first step S1, the current value $P_0$ of the sum of air-conditioning power of the air conditioner 5 and the fan unit 3 is acquired. This step can be executed by causing the control unit 20 to calculate a sum of the electric power of the air conditioner 5 and the fan unit 3 by using the first power information $S_f$ and the second power information $S_c$.

Next, the method proceeds to step S2, in which the control unit 20 determines whether or not the air conditioner 5 is stopped. This step is executed by causing the control unit 20 to obtain the operating rate $\theta$ of the air conditioner 5 on the basis of the second operating rate information $S\theta$, and to determine that the air conditioner 5 is stopped when the operating rate $\theta$ is equal to 0, and to determine that the air conditioner 5 is not stopped when the operating rate $\theta$ is not equal to 0.

Here, the method proceeds to step S3 when the air conditioners 5 are determined to be not stopped (NO).

In step S3, a first assumed value $P_1$ of the sum of the air-conditioning power of the air conditioners 5 and the fan unit 3, which is assumed to be consumed in the case of cooling the temperature of each electronic device 6 to the aforementioned specified temperature $T_s$ by using only the first cooling wind B1 while stopping the air conditioners 5, is calculated.

When the air conditioners 5 are stopped in this manner, the power included in the first assumed value $P_1$ consists only of power consumption $P_{1F}$ of the fan unit 3, and hence the relation $P_1 = P_{1F}$ holds.

Here, when the outside air temperature T is high or when the operating rate $\phi_0$ of each electronic device 6 is large, the air volume of the first cooling wind B1 required for cooling each electronic device 6 to the specified temperature $T_s$ also becomes large. As a consequence, the power consumption $P_{1F}$ is increased as well.

The power consumption $P_{1F}$ depends on the outside air temperature T and the operating rate $\phi_0$ in this manner. Although the operating rates $\phi_0$ vary among the electronic devices 6, one representative value $\phi$ representing the plurality of the operating rates $\phi_0$ is used in this embodiment, and the power consumption $P_{1F}$ is expressed as $P_{1F} = f(T, \phi)$ by using an appropriate function f. Here, an average value or a maximum value of the plurality of operating rates $\phi_0$ can be used as the representative value $\phi$.

The function f provides the first assumed value $P_1$ of the air-conditioning power required for cooling the temperature of each electronic device 6 to the specified temperature $T_s$ when the values T and $\phi$ are given. The function f is an example of the above-mentioned first database 31.

Figure 7:
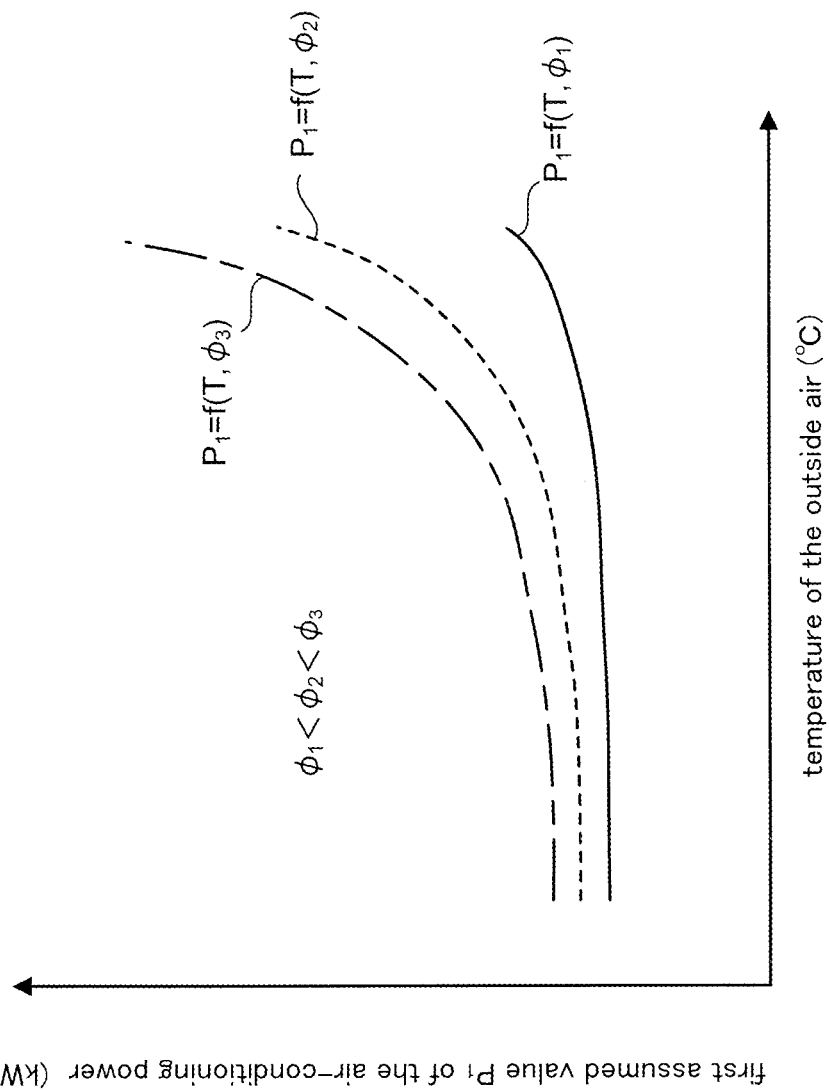
FIG. 7 is a graph schematically illustrating a first database used in the first embodiment.

FIG. 7 is a graph schematically illustrating the first database 31.

Each curve in FIG. 7 represents the above-described function f in the form of a graph. The horizontal axis of the graph is the temperature T of the outside air A, while the vertical axis thereof is the first assumed value $P_1$ of the air-conditioning power.

Note that FIG. 7 illustrates three graphs respectively corresponding to progressively-increasing representative values $\phi_1$, $\phi_2$, and $\phi_3$. These graphs can be obtained by means of simulation, or by conducting experiments while actually operating the modular data center 1.

By referring to the first database 31, the control unit 20 can acquire the first assumed value $P_1$ that corresponds to the current values of T and φ.

Note that the first database 31 is not limited to the graphs illustrated in FIG. 7. The first database 31 may be a table that stores the respective values T, φ, and $P_1$.

On the other hand, the method proceeds to step S4 when the air conditioner 5 is determined to be stopped (YES) in step S2 of FIG. 5.

In this step, a second assumed value $P_2$ of the sum of the air-conditioning power of the air conditioners 5 and the fan unit 3, which is assumed to be consumed in the case of cooling the temperature of each electronic device 6 to the aforementioned specified temperature $T_s$ by using the both of the first cooling wind B1 and the second cooling winds B2 while operating the air conditioners 5, is calculated as described below.

When the air conditioners 5 are operated, the second assumed value $P_2$ is equal to a sum of power consumption $P_{2F}$ of the fan unit 3 and power consumption $P_{2C}$ of the air conditioners 5.

However, the second cooling wind B2 having a lower temperature than that of the outside air A is supplied to each electronic device 6 as a consequence of operating the air conditioners 5. Accordingly, the temperature at the intake face 6a drops below the temperature T of the outside air A. Let $T_C$ be the amount of this drop. Then, the temperature at the intake face 6a becomes $T-T_C$. Therefore, the power consumption $P_{2F}$ of the fan unit 3 can be expressed as $P_{2F}=f(T-T_C, \phi)$ by using the aforementioned function f.

The temperature drop $T_C$ is thought to become small when the operating rate θ of the air conditioner 5 is small. Meanwhile, the temperature drop $T_C$ is thought to become small depending on the temperature T of the outside air A. Moreover, when the evaporative cooling device as illustrated in FIG. 5 is used as the air conditioner 5, the temperature drop $T_C$ is thought to become small when the humidity H of the outside air A is high and thus the evaporation of the water does not progress.

In this manner, the temperature drop $T_C$ depends on the parameters θ, T, and H. Accordingly, in this embodiment, the temperature drop $T_C$ will be expressed as $T_C=h(T, H, \theta)$ by using an appropriate function h. The form of the function h can be obtained by means of simulation, or by conducting experiments while actually operating the modular database 1.

By using this function h, the power consumption $P_{2F}$ of the fan unit 3 can be expressed as $P_{2F}=f(T-h(T, H, \theta), \phi)$.

On the other hand, the power consumption $P_{2C}$ of the air conditioners 5 become small when the operating rate θ of the air conditioners 5 is small. Moreover, the evaporative latent heat of the water becomes less available depending on the temperature T and the humidity H of the outside air A, and hence the power consumption $P_{2C}$ is thought to vary as a consequence. Since the power consumption $P_{2C}$ depends on the values of T, H, and θ in this manner, the power consumption $P_{2C}$ will be expressed as $P_{2C}=g(T, H, \theta)$ by using an appropriate function g in this embodiment.

The form of the function g can be obtained by means of simulation, or by conducting experiments while actually operating the modular data center 1.

As a consequence, the second assumed value $P_2$ of the air-conditioning power is expressed as $P_{2F}+P_{2C}=f(T-h(T, H, \theta), \phi)+g(T, H, \theta)$. By using this equation, the second assumed values $P_2$ corresponding to the parameters T, H, θ, and φ are stored in the second database 32 in advance. Here, when the packaged air conditioner which does not use the evaporative latent heat of the water is employed as the air conditioner 5, the humidity H may be deleted from the second database 32 since the power consumption $P_{2C}$ of the air conditioner 5 does not depend on the humidity H of the outside air A.

Then, step S4 can be executed by causing the control unit 20 to refer to the second database 32 and to read the second assumed value $P_2$ corresponding to the given parameters T, H, θ, and φ.

Here, since the temperature drop $T_C$ at the intake face 6a is considered in the function f as described above, the function f used as the second database 32 can be deemed to be corrected in consideration of the temperature drop $T_C$. For this reason, in this embodiment, it is possible to accurately obtain the second assumed value $P_2$ to be expected in the future while taking into account the temperature drop $T_C$.

After step S3 or step S4 is completed as described above, the method proceeds to step S5 of FIG. 6.

In step S5, the control unit 20 evaluates a magnitude relationship between the current value $P_0$ and the first assumed value $P_1$ of the air-conditioning power, and a magnitude relationship between the current value $P_0$ and the second assumed value $P_2$ of the air-conditioning power.

Here, the first assumed value $P_1$ is the assumed value of the sum of the air-conditioning power of the air conditioners 5 and the fan unit 3, which is assumed to be consumed in the case of stopping the air conditioners 5. Accordingly, when the first assumed value $P_1$ is evaluated to be smaller than the current value $P_0$ ($P_1<P_0$), the air-conditioning power can be reduced as compared to the current situation if the air conditioners 5 are stopped. Therefore, the control unit 20 stops the air conditioners 5 when the relation is evaluated as $P_1<P_0$.

On the other hand, the second assumed value $P_2$ is the assumed value of the sum of the air-conditioning power of the air conditioners 5 and the fan unit 3, which is assumed to be consumed in the case of operating the air conditioners 5. Accordingly, when the second assumed value $P_2$ is evaluated to be smaller than the current value $P_0$ ($P_2<P_0$), the air-conditioning power can be reduced as compared to the current situation if the air conditioners 5 are operated. Therefore, the control unit 20 operates the air conditioners 5 when the relation is evaluated as $P_2<P_0$.

FIG. 8 schematically illustrates the contents of the processing in step S5. In FIG. 8, the first database 31 and the second database 32 are schematically illustrated in tables, respectively.

The first database 31 is formed by relating the first assumed value $P_1$ of the air-conditioning power to the temperature T of the outside air A and the representative value φ of the electronic devices 6. However, in FIG. 8, the temperature T and the humidity H of the outside air A are set as entries of the table, whereas the representative value φ is omitted from the entry. The reason for setting the humidity H as the entry is to formally conform the style of the table to that of the second database 32.

Meanwhile, the second database 32 is formed by relating the second assumed value $P_2$ of the air-conditioning power to the temperature T, the humidity H, the representative value φ, and the operating rate θ of the air conditioners 5. However, in FIG. 8, only the temperature T and the humidity H are set as the entries of the table, whereas the rest of items are omitted in the table. The reason for omitting these items is to formally conform the style of the table to that of the first database 31.

As illustrated in the first database 31 of FIG. 8, when the current temperature T is 28° C. and the current humidity H is 70%, the first assumed value $P_1$ is 1.186 kW. Therefore, when the air conditioners 5 are currently in operation and the current value $P_0$ of the air-conditioning power is equal to or above 1.186 kW (=$P_1$), then the air-conditioning power is reduced as compared to the current situation by stopping the air conditioners 5.

Meanwhile, according to the second database 32, when the current temperature T is 28° C. and the current humidity H is 70%, the second assumed value $P_2$ is 1.378 kW. Therefore, when the air conditioners 5 are currently stopped and the current value $P_0$ of the air-conditioning power is equal to or above 1.378 kW (=$P_2$), then the air-conditioning power is reduced as compared to the current situation by operating the air conditioners 5.

Likewise, when the current temperature T is 31° C. and the current humidity H is 20%, the necessity to operate the air conditioners 5 is determined by comparing the current value $P_0$ of the air-conditioning power with the first assumed value $P_2$ (1.549 kW) and the second assumed value $P_2$ (1.235 kW).

Thereafter, the determination of the necessity to operate the air conditioners 5 in step S5 is continuously conducted by repeating the above-described control at time intervals of several seconds, so that the power consumption of the modular data center 1 is reduced.

Up to this, the basic steps of the controlling method of the modular data center 1 of this embodiment are completed.

According to the above-described embodiment, the necessity to operate the air conditioners 5 is determined in step S5 by comparing the current value $P_0$ of the air-conditioning power with the assumed values $P_2$ and $P_2$ thereof. Thus, it is possible to stop or operate the air conditioners 5 quickly while forecasting future situations.

Moreover, since the determination is made with reference to the first database 31 and the second database 32, it is not necessary to measure the air-conditioning power after actually stopping or operating the air conditioners 5. Thus, the necessity to operate the air conditioners 5 can be promptly determined.

Particularly, by using the representative value $\phi$ of the operating rates of the electronic devices 6 for the entry in the databases 31 and 32, it is possible to quickly cool the electronic device 6 such as a server, in which the air volume of the first cooling wind B1 required for cooling to the specified temperature $T_s$ varies depending on the operating rate.

(Second Embodiment)

In the first embodiment, the second assumed value $P_2$ (=$P_{2F}$+$P_{2C}$) of the air-conditioning power, which is assumed to be consumed in the case of operating the air conditioners (see FIG. 5) and the fan unit 3, is calculated by referring to the second database 32 in step S4 of FIG. 6.

When the air conditioners 5 are operated in this manner, the second cooling winds B2 are supplied to an upstream side of the fan unit 3. Accordingly, a static pressure of each fan 3a changes as compared to the case where the air conditioners 5 are stopped.

In this embodiment, the second database 32 is corrected as described below while considering such a change in static pressure. Then, the modular data center 1 (see FIG. 1) is operated in accordance with the flowchart of FIG. 6 by using the corrected second database 32.

The above-described static pressure of the fan 3a is defined as a difference in pressure between the upstream side and the downstream side of the fan 3a. In the state where the fan 3a is rotated, the pressure on the upstream side of the fan 3a which takes in the outside air A becomes lower than the pressure on the downstream side. In contrast, when the second cooling wind B2 is created by operating the air conditioner 5, the pressure on the upstream side of the fan 3a is increased, thereby the static pressure of the fan 3a is reduced.

As a result, the fan unit 3 can create the first cooling wind B1 in the same amount as the amount before operating the air conditioners 5, even with the lower power consumption than that before operating the air conditioners 5, thus cooling each electronic device 6 to the specified temperature $T_s$ in conjunction with the second cooling winds B2.

The static pressure of each fan 3a influences the power consumption $P_{2F}$ of the fan unit 3 in this manner. In the following, a value obtained by correcting the power consumption $P_{2F}$ in consideration of the change in static pressure of the fan 3a will be denoted by $P'_{2F}$. The value $P'_{2F}$ is a value obtained by correcting the power consumption $P_{2F}$ of the fan unit 3, which is required for cooling each electronic device 6 to the specified temperature $T_s$, while considering the static pressure of each fan 3a.

The value $P'_{2F}$ is thought to depend on the operating rate $\theta$ of the air conditioner 5 and the power consumption $P_{2F}$ before the correction. Accordingly, the value $P'_{2F}$ can be expressed as $P'_{2F}=i(P_{2F}, \theta)$ by using an appropriate function i.

The function i may be determined by using a static pressure–air volume characteristic of the fan 3a, or may be obtained by experiments while actually operating the modular data center 1.

Figure 9:
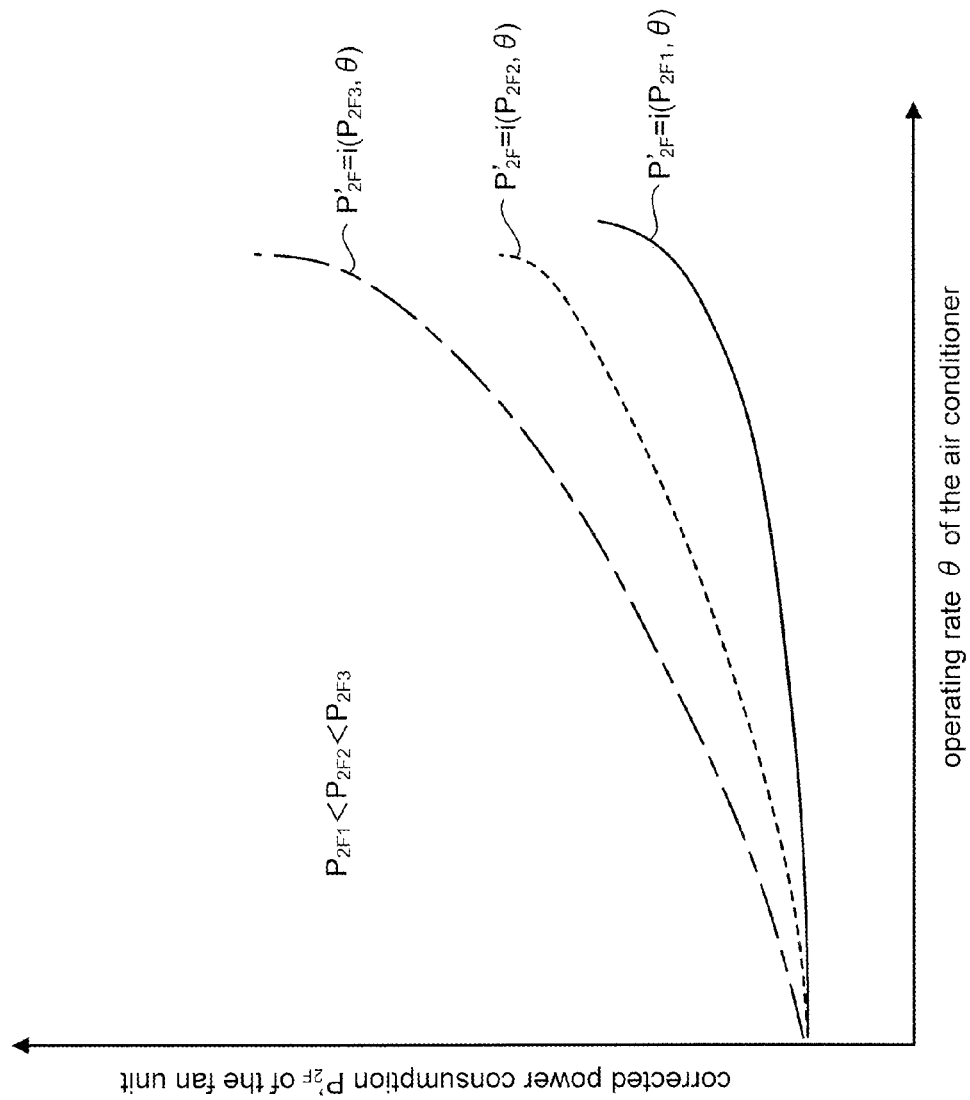
FIG. 9 is a graph schematically illustrating a function i used in a second embodiment.

FIG. 9 is a graph schematically illustrating the above-described function i.

Each curve in FIG. 9 represents the above-described function i in the form of a graph. The horizontal axis of the graph is the operating rate $\theta$ of each air conditioner 5, while the vertical axis thereof is the power consumption $P'_{2F}$ of the fan unit 3 after the correction.

Note that FIG. 9 illustrates three graphs respectively corresponding to progressively-increasing values of the power consumption $P_{2F1}$, $P_{2F2}$, and $P_{2F3}$ before the correction.

In the first embodiment, the second assumed value $P_2$ is obtained by the equation $P_2=P_{2F}+P_{2C}$. As a consequence of correcting the power consumption $P_{2F}$ as described above, the second assumed value $P_2$ is obtained by an equation $P_2=P'_{2F}+P_{2C}$ in this embodiment. When this equation is expressed by using the functions f, g, and h of the first embodiment and the above-described function i, then the equation turns out to be $P_2=P'_{2F}+P_{2C}=i(P_{2F}, \theta)+P_{2C}=i(f(T-h(T, X, \theta), \phi), \theta)+g(T, x, \theta)$. This equation corresponds to the second database 32 which obtains the second assumed value $P_2$ from the parameters T, x, $\theta$, and $\phi$. In this equation, the change in static pressure of the fan 3a is taken into account by using the function i.

In this embodiment, the second assumed value $P_2$ can be obtained from the current parameters T, x, $\theta$, and $\phi$ by referring to the second database 32 in step S4 of FIG. 6.

According to the above-described embodiment, the second database 32 is corrected while taking into account the change in static pressure of the fan 3a, which is assumed to occur in the case of operating the air conditioner 5. Thus, it is possible to accurately obtain the second assumed value $P_2$ to be expected in the future while taking into account the static pressure.

(Experimental Results)

Next, experiments conducted by the inventors of the present application will be described.

In FIG. 2, the upper limit temperature $T_2$ of the operation guarantee region S is employed as one of the threshold temperatures used for operating the air conditioner 5.

An investigation conducted in order to investigate how much of the operation region Q to operate the air conditioners 5 spreads to a low-temperature side by operating the data center 1 in accordance with the first embodiment or the second embodiment.

Here, the dimensions of the container 2 used for this investigation include a depth of 3474.6 mm, a width of 2331.6 mm, and a height of 2769.7 mm. Meanwhile, an evaporative cooling device which can take action of only one of stop and operation at a time was used as the air conditioner 5. This air conditioner 5 exhibits the operating rate θ of either 0% or 100%. Furthermore, the values of the power consumption $P_{2C}$ of the air conditioner 5 were fixed to two values of $P_{2C}$=g(T, H, 0%)=0 kW and $P_{2C}$=g(T, H, 100%)=0.35 kW regardless of the values of the temperature T and the humidity H of the outside air A.

Figure 10:
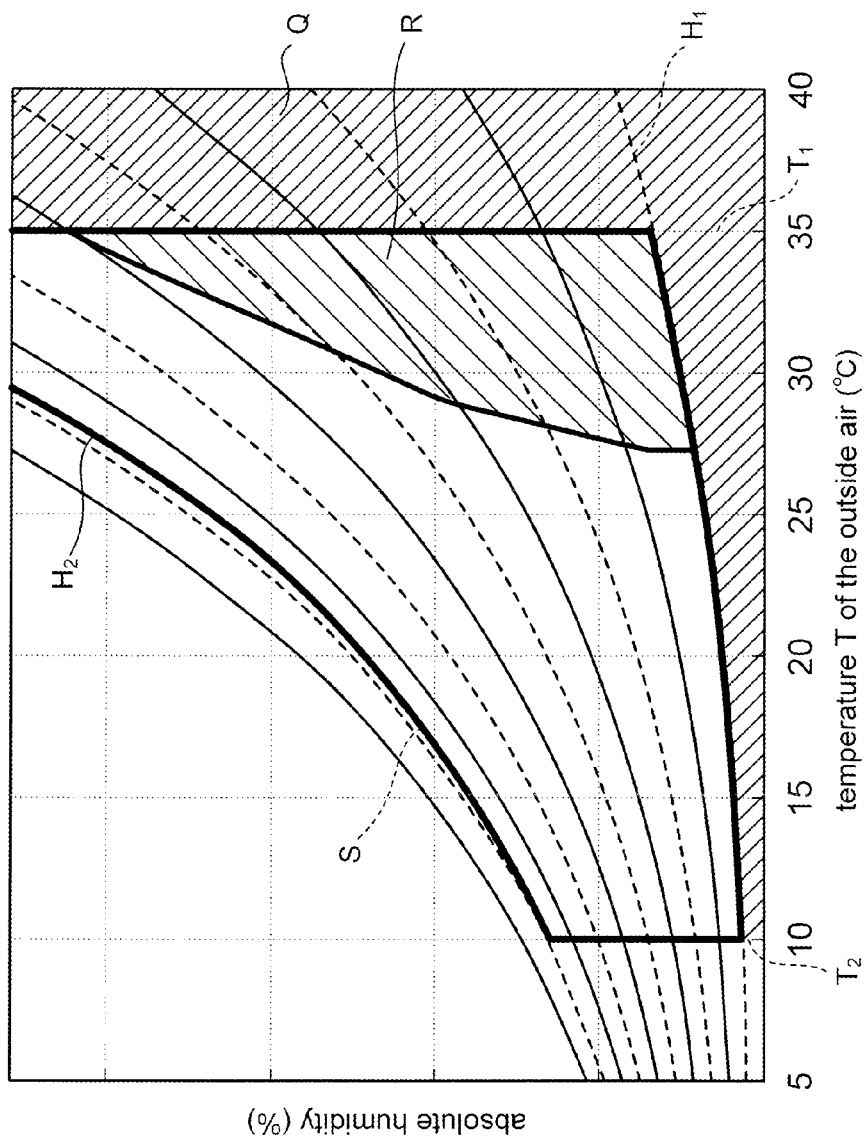
FIG. 10 is a graph illustrating an operation region when the modular data center is operated in accordance with the first embodiment or the second embodiment.

FIG. 10 is a graph illustrating the operation region Q when the modular data center 1 is operated in accordance with the first embodiment or the second embodiment under the above-mentioned conditions. Note that the elements explained with reference to FIG. 2 are denoted by the same reference numerals as those in FIG. 2 and descriptions thereof will be omitted hereinbelow.

As illustrated in FIG. 10, the operation region Q to operate the air conditioners 5 was successfully expanded to a region R by operating the modular data center 1 in accordance with the first embodiment or the second embodiment.

The region R is a region where it is possible to reduce the air-conditioning power of the fan unit 3 and the air conditioners 5 by operating the air conditioners 5 as compared to the case of stopping the air conditioners 5. In the meantime, the region R where the air conditioner 5 is operable spreads more to the low-temperature side as the humidity H of the outside air A is lower. Hence, it was made clear that the air-conditioning power could be reduced more than that in the case of FIG. 2 by operating the air conditioner 5 even when the temperature T of the outside air A was equal to 27° C.

The above-described effect of reducing the air-conditioning power becomes higher as the air-conditioning capacity of each air conditioner 5 is higher. According to the first and second embodiments, under a high-temperature and low-humidity environment where the temperature T of the outside air A was equal to 34.5° C. and the humidity H thereof was equal to 10%, the air-conditioning power was successfully reduced by 38.2% as compared to the case of FIG. 2.

The inventors of the present application also investigated how much of the electrical energy of the air-conditioning power for the modular data center 1 could be reduced in one year by operating the data center 1 in accordance with the first embodiment or the second embodiment.

Figure 11:
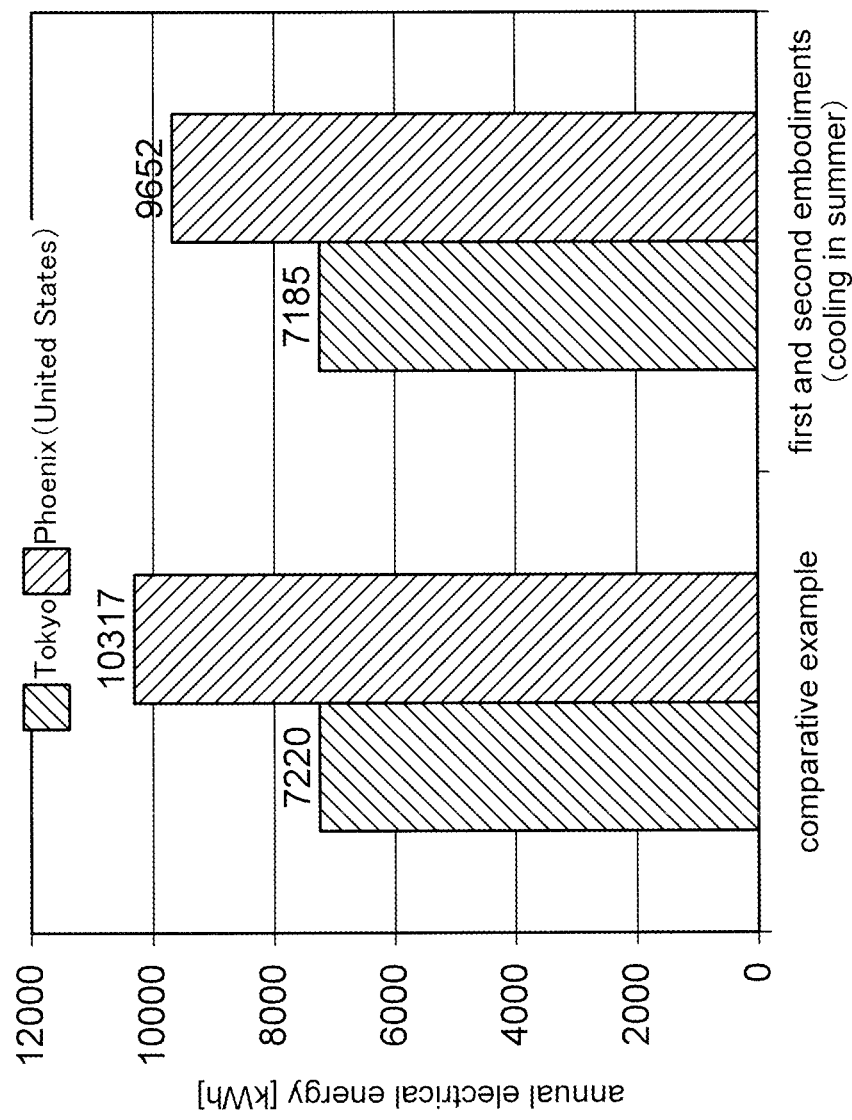
FIG. 11 is a graph illustrating a result of an investigation to investigate how much of an amount of power as air-conditioning power for the modular data center can be reduced in one year according to the first embodiment or the second embodiment.

FIG. 11 illustrates a result of this investigation.

In this investigation, the electrical energy of the air-conditioning power for the modular data center 1 in one year were estimated for the cases of installing the modular data center 1 in Tokyo having humid subtropical climate and in Phoenix US having desert climate, respectively.

The evaporative cooling device used as the air conditioner 5 is configured to cool the outside air A by use of the evaporative latent heat of the water. Accordingly, the evaporative cooling device is likely to be used for a longer period of time in Phoenix than in Tokyo, since the Phoenix has the desert climate where the evaporation of the water is accelerated.

In comparative examples where the necessity to operate the air conditioners 5 is determined on the basis of the upper limit temperature $T_2$ as illustrated in FIG. 2 while not applying the first or second embodiment, annual operating periods of the air conditioners 5 were 13 hours in Tokyo and 1157 hours in Phoenix.

On the other hand, when the modular data center 1 was operated in accordance with the first or second embodiment, the operating periods of the air conditioners 5 were increased by 244 hours in Tokyo and 1994 hours in Phoenix. In the first and second embodiments, the air conditioners 5 are operated only when it is determined that the operation can reduce the air-conditioning power as compared to the current situation. Accordingly, when the operating periods of the air conditioners 5 become longer in this manner, the effects of reducing the air-conditioning power becomes higher.

As a consequence, as illustrated in FIG. 11, annual reduction amounts of the electrical energy of the air-conditioning power were 35 kWh in Tokyo and 666 kWh in Phoenix, respectively. Thus, it was revealed that the electrical energy of the sum of power consumed by the fan unit 3 and the air conditioners 5 can be reduced by 0.5% in Tokyo and by 6.5% in Phoenix in one year.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A modular data center comprising: an enclosure including a first intake port and a second intake port: a fan provided in the enclosure and configured to create a first cooling wind from outside air without changing a temperature of the outside air by taking in the outside air through the first intake port:
   an air conditioner provided in the enclosure and configured to create a second cooling wind having a temperature lower than the temperature of the outside air by taking in the outside air through the second intake port:
   a plurality of racks provided in the enclosure and configured to house a plurality of electronic devices each provided with an intake face to take in the first cooling wind and the second cooling wind; and
   a control unit configured to adjust an air volume of the first cooling wind by controlling the fan, and so as to cool a temperature of each electronic device to a specified temperature,
   wherein the control unit includes a processor, the processor executes:
   determining whether or not the air conditioner is in a stopped status;
   when the air conditioner is not in the stopped status, stopping the air conditioner when a first assumed value of a sum of air-conditioning power of the air conditioner and the fan, which is assumed to be consumed in a case of cooling the temperature of each electronic device to the specified temperature by using the first cooling wind while stopping the air conditioner, is smaller than a current value of the air-conditioning power, and when the air conditioner is in the stopped status, operating the air conditioner when a second assumed value of the sum of air-conditioning power of the air conditioner and the fan, which is assumed to be consumed in a case of cooling the temperature of each electronic device to the specified temperature by using the first cooling wind and the second cooling wind while operating the air conditioner, is smaller than the current value of the air-conditioning power.

2. The modular data center according to claim 1, wherein the processor configured to:

refer to a first database formed by relating the first assumed value to a representative value of operating rates of the plurality of electronic devices and the temperature of the outside air, and thus to obtain the first assumed value corresponding to the representative value and the temperature of the outside air in a current situation, refer to a second database formed by relating the second assumed value to the representative value of the operating rates of the plurality of electronic devices, an operating rate of the air conditioner, and the temperature of the outside air, and thus to obtain the second assumed value corresponding to the representative value, the operating rate of the air conditioner, and the temperature of the outside air in the current situation, and determine whether to stop or operate the air conditioner by using the first assumed value and the second assumed value obtained by referring to the first database and the second database.

3. The modular data center according to claim 2, wherein the second database is corrected in consideration of a temperature drop at the intake face assumed to occur in the case of operating the air conditioner.

4. The modular data center according to claim 2, wherein the second database is corrected in consideration of a change in static pressure of the fan assumed to occur in the case of operating the air conditioner.

5. The modular data center according to claim 2, wherein the air conditioner creates the second cooling wind by exposing the outside air to water.

6. The modular data center according to claim 5, wherein the second database is formed by relating the second assumed value to the representative value of the operating rates of the plurality of electronic devices, the operating rate of the air conditioner, the temperature of the outside air, and a humidity of the outside air.

7. A controlling method of a modular data center, the method comprises:

cooling a plurality of electronic devices provided in an enclosure by causing an intake face of each electronic device to take in a first cooling wind created from outside air without changing a temperature of the outside air by taking in the outside air through a first intake port provided on the enclosure, and a second cooling wind created by an air conditioner and having a temperature lower than the temperature of the outside air by taking in the outside air through a second intake port provided on the enclosure:

acquiring a current value of a sum of air-conditioning power consumed by the air conditioner and the fan;

calculating a first assumed value of a sum of air-conditioning power assumed to be consumed by the air conditioner and the fan in a case of cooling a temperature of each electronic device to a specified temperature by using the first cooling wind while stopping the air conditioner;

calculating a second assumed value of a sum of air-conditioning power assumed to be consumed by the air conditioner and the fan in a case of cooling the temperature of each electronic device to the specified temperature by using the first cooling wind and the second cooling wind while operating the air conditioner;

determining whether or not the air conditioner is in a stopped status;

when the air conditioner is not in the stopped status, stopping the air conditioner when the first assumed value is smaller than the current value; and when the air conditioner is in the stopped status, operating the operating the air conditioner when the second assumed value is smaller than the current value.

8. The controlling method of a modular data center according to claim 7, wherein the calculating of the first assumed value includes referring to a first database formed by relating the first assumed value to a representative value of operating rates of the plurality of electronic devices and the temperature of the outside air, and thus obtaining the first assumed value corresponding to the representative value and the temperature in a current situation, and the calculating of the second assumed value includes referring to a second database formed by relating the second assumed value to the representative value of the operating rates of the plurality of electronic devices, an operating rate of the air conditioner, and the temperature of the outside air, and thus obtaining the second assumed value corresponding to the representative value, the operating rate of the air conditioner, and the temperature in the current situation.

9. The controlling method of a modular data center according to claim 8, wherein the second database is corrected in consideration of a temperature drop at the intake face assumed to occur in the case of operating the air conditioner.

10. The controlling method of a modular data center according to claim 8, wherein the second database is corrected in consideration of a change in static pressure of the fan assumed to occur in the case of operating the air conditioner.

* * * * *